US010770381B2

(12) United States Patent
Padmanabhan et al.

(10) Patent No.: US 10,770,381 B2
(45) Date of Patent: \*Sep. 8, 2020

(54) SEMICONDUCTOR COMPONENT AND METHOD OF MANUFACTURE

(71) Applicant: Semiconductor Components Industries, LLC, Phoenix, AZ (US)

(72) Inventors: Balaji Padmanabhan, Tempe, AZ (US); Ali Salih, Mesa, AZ (US); Prasad Venkatraman, Tempe, AZ (US)

(73) Assignee: SEMICONDUCTOR COMPONENTS INDUSTRIES, LLC, Phoenix, AZ (US)

( \* ) Notice: Subject to any disclaimer, the term of this patent is extended or adjusted under 35 U.S.C. 154(b) by 150 days.

This patent is subject to a terminal disclaimer.

(21) Appl. No.: 16/036,560

(22) Filed: Jul. 16, 2018

(65) Prior Publication Data

US 2018/0342448 A1    Nov. 29, 2018

Related U.S. Application Data

(62) Division of application No. 15/204,261, filed on Jul. 7, 2016, now Pat. No. 10,128,174.

(Continued)

(51) Int. Cl.
*H01L 23/495* (2006.01)
*H01L 21/48* (2006.01)
(Continued)

(52) U.S. Cl.
CPC .... *H01L 23/49575* (2013.01); *H01L 21/4853* (2013.01); *H01L 23/49524* (2013.01); *H01L 23/49531* (2013.01); *H01L 23/49562* (2013.01); *H01L 24/06* (2013.01); *H01L 24/40* (2013.01); *H01L 24/48* (2013.01); *H01L 24/73* (2013.01); *H01L 25/072* (2013.01);
(Continued)

(58) Field of Classification Search
CPC .................... H01L 25/072; H01L 23/36–3738
See application file for complete search history.

(56) References Cited

U.S. PATENT DOCUMENTS 7,745,913 B2    6/2010    Hosseini et al.
8,455,987 B1    6/2013    Spann et al.
(Continued)

*Primary Examiner* — Stephen M Bradley
(74) *Attorney, Agent, or Firm* — Rennie William Dover

(57) ABSTRACT

In accordance with an embodiment, a semiconductor component includes a support and a plurality of leads. An insulated metal substrate having a first portion and a second portion bonded to the support. A semiconductor chip comprising a III-N semiconductor material is bonded to the first portion of the insulated metal substrate and a first electrical interconnect is coupled between a drain bond pad the first portion of the insulated metal substrate. A second semiconductor chip is bonded to the first electrical interconnect. A second electrical interconnect coupled between a lead of the plurality of leads and the second semiconductor chip. In accordance with another embodiment, a method of manufacturing a semiconductor component includes coupling a first semiconductor chip to a first electrically conductive layer and coupling a second semiconductor chip to a second electrically conductive layer.

21 Claims, 11 Drawing Sheets

Related U.S. Application Data

(60) Provisional application No. 62/196,650, filed on Jul. 24, 2015.

(51) Int. Cl.
*H01L 23/00* (2006.01)
*H01L 29/20* (2006.01)
*H01L 29/772* (2006.01)
*H01L 25/07* (2006.01)
*H01L 23/373* (2006.01)

(52) U.S. Cl.
CPC ........ *H01L 29/2003* (2013.01); *H01L 29/772* (2013.01); *H01L 23/3735* (2013.01); *H01L 2224/0603* (2013.01); *H01L 2224/37099* (2013.01); *H01L 2224/40095* (2013.01); *H01L 2224/40245* (2013.01); *H01L 2224/48091* (2013.01); *H01L 2224/48247* (2013.01); *H01L 2224/73221* (2013.01); *H01L 2924/00014* (2013.01)

(56) References Cited

U.S. PATENT DOCUMENTS

| | | |
|---|---|---|
| 10,128,174 B2 * | 11/2018 | Padmanabhan ......... H01L 24/48 |
| 2005/0285228 A1 | 12/2005 | Sugawara |
| 2006/0237825 A1 | 10/2006 | Pavier et al. |
| 2007/0057284 A1 | 3/2007 | Casey et al. |
| 2007/0138651 A1 | 6/2007 | Hauenstein |
| 2007/0249092 A1 | 10/2007 | Joshi et al. |
| 2008/0164590 A1 | 7/2008 | Xiaochun et al. |
| 2010/0232131 A1 | 9/2010 | Qian et al. |
| 2011/0133251 A1 | 6/2011 | He |
| 2012/0223321 A1 | 9/2012 | Lin et al. |
| 2012/0223322 A1 * | 9/2012 | Lin .................... H01L 27/0605 257/76 |
| 2013/0069208 A1 | 3/2013 | Briere |
| 2013/0088280 A1 | 3/2013 | Lal et al. |
| 2013/0175704 A1 | 7/2013 | Jeun |
| 2013/0187627 A1 | 7/2013 | Imada et al. |
| 2013/0256856 A1 | 10/2013 | Mahler et al. |
| 2014/0103510 A1 | 4/2014 | Andou |
| 2014/0197525 A1 | 7/2014 | Kadoguchi |
| 2014/0239472 A1 | 8/2014 | Jones et al. |
| 2014/0306238 A1 | 10/2014 | Taniguchi et al. |
| 2014/0361419 A1 | 12/2014 | Xue et al. |
| 2015/0145112 A1 | 5/2015 | Otremba |
| 2016/0211246 A1 | 7/2016 | Akiyama et al. |
| 2016/0247792 A1 | 8/2016 | Chang |

* cited by examiner

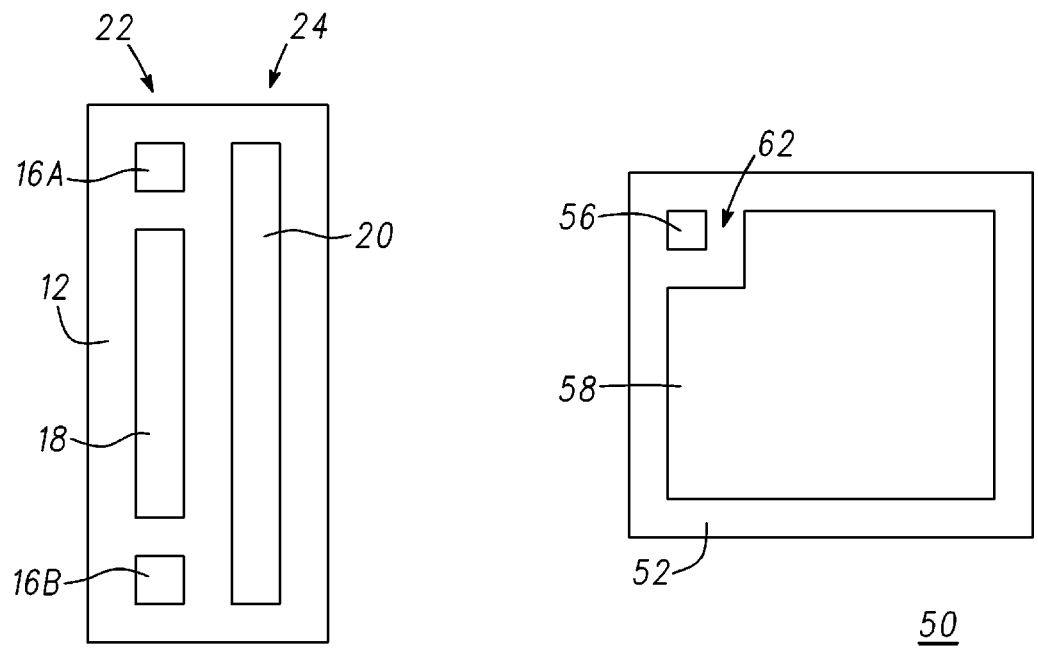
FIG. 1
FIG. 2
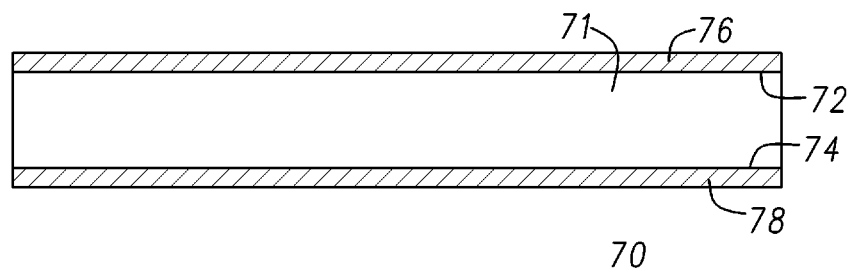
FIG. 3

SEMICONDUCTOR COMPONENT AND METHOD OF MANUFACTURE

The present application is a divisional application of Nonprovisional patent application Ser. No. 15/204,261 filed on Jul. 7, 2016, by Balaji Padmanabhan et al., titled "SEMICONDUCTOR COMPONENT AND METHOD OF MANUFACTURE", which is a Nonprovisional application of Provisional Patent Application No. 62/196,650 filed on Jul. 24, 2015, by Balaji Padmanabhan et al., titled "SEMICONDUCTOR COMPONENT AND METHOD OF MANUFACTURE", which are hereby incorporated by reference in their entirety, and priority thereto for common subject matter is hereby claimed.

TECHNICAL FIELD

The present invention relates, in general, to electronics and, more particularly, to semiconductor structures thereof, and methods of forming semiconductor devices.

BACKGROUND

In the past, semiconductor manufacturers have used a combination of silicon semiconductor materials and III-N semiconductor materials to manufacture cascoded devices, such as a normally-on III-N depletion mode HEMT cascoded with a enhancement mode silicon device. Using this combination of materials helps achieve a normally-off state using a III-N depletion mode device that is normally-on. Cascoded semiconductor devices have been described in U.S. Patent Application Publication Number 2013/0088280 A1 by Rakesh K. Lal et al. and published on Apr. 11, 2013.

After manufacturing cascoded devices from different semiconductor substrate materials, semiconductor component manufacturers typically protect the silicon device and the depletion mode devices in separate packages and connect the devices in the separate packages together via leadframe leads to form a cascoded device. A drawback with this approach is that increasing the number of packages increases the cost of a cascoded semiconductor component and degrades the performance of the cascoded devices because of increased parasitics such as parasitic capacitance and parasitic inductance.

Accordingly, it would be advantageous to have a cascoded semiconductor device and a method for manufacturing the cascoded semiconductor device. It would be of further advantage for the structure and method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which:

FIG. 1 is a top view of a semiconductor chip suitable for use in manufacturing a cascode configured semiconductor component in accordance with an embodiment of the present invention;

FIG. 2 is a top view of a semiconductor chip suitable for use in manufacturing a cascode configured semiconductor component in accordance with an embodiment of the present invention;

FIG. 3 is a cross-sectional view of a semiconductor chip suitable for use in manufacturing a cascode configured semiconductor component in accordance with an embodiment of the present invention;

Figure 4:
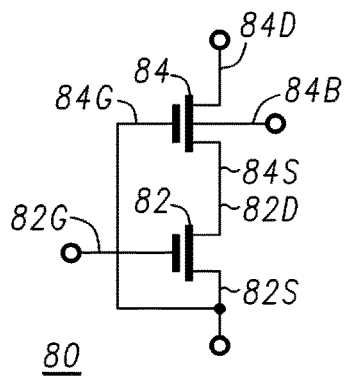
FIG. 4 is a circuit schematic of a semiconductor component in a cascode FET configuration, wherein a substrate of a III-N device is floating.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain n-channel or p-channel devices, or certain n-type or p-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of being exactly as described.

DETAILED DESCRIPTION

FIG. 1 is a top view of a semiconductor chip 10 suitable for use in manufacturing a semiconductor component in accordance with an embodiment of the present invention. Semiconductor chip 10 has a top surface 12 and a bottom surface 14 (shown in FIG. 11), wherein gate bond pads 16A and 16B are formed on or from portions of top surface 12, a source bond pad 18 formed on or from another portion of top surface 12, and a drain bond pad 20 is formed on or from another portion of top surface 12. Gate bond pads 16A and 16B and source bond pad 18 are formed on a side or region 22 of semiconductor chip 10 whereas drain bond pad 20 is formed on a side or region 24 of semiconductor chip 10. Thus, semiconductor chip includes a III-N Field Effect Transistor (FET). In accordance with an embodiment, semiconductor chip 10 is fabricated from a compound semiconductor material such as, for example, a III-nitride semiconductor material. Thus, semiconductor chip 10 may be referred to as a III-nitride semiconductor chip, i.e., the substrate material of III-nitride semiconductor chip 10 comprises a III-nitride material such as, for example, aluminum nitride, gallium nitride, or the like. A III-nitride semiconductor material may be referred to as a III-N semiconductor material, a III-nitride based semiconductor material, a III-N based semiconductor material, or the like. This material may be referred to as a body of semiconductor material. A semiconductor chip such as, for example, semiconductor chip 10, may be referred to as a semiconductor die. In accordance with embodiments in which semiconductor chip 10 comprises a III-N FET, semiconductor chip 10 may be referred to as a III-N FET or a III-N transistor. Alternatively, semiconductor chip 10 can also be fabricated on silicon substrate.

FIG. 2 is a top view of a semiconductor chip 50 suitable for use in manufacturing a semiconductor component in accordance with an embodiment of the present invention. Semiconductor chip 50 has a top surface 52 and a bottom surface 54 (shown in FIG. 13), wherein a gate bond pad 56 is formed on or from a portion of top surface 52, a source bond pad 58 formed on or from another portion of top surface 52, and a drain bond pad 60 is formed on or from bottom surface 54 (shown in FIG. 13). In accordance with an embodiment, semiconductor chip 50 is a rectangular shaped silicon based semiconductor material, wherein the semiconductor material may be referred to as a body of semiconductor material. Source bond pad 58 is an electrically conductive material that has a rectangular shape with two opposing sides, wherein a notch 62 is formed in a corner of the source bond pad 58. Gate bond pad 56 is formed in the region of notch 62. Drain bond pad 60 is formed on or from bottom surface 54. The positions of the pads for semiconductor chip 50 are not a limitation of the present invention.

FIG. 3 is a cross-sectional view of a semiconductor chip 70 suitable for use in manufacturing a semiconductor component in accordance with an embodiment of the present invention. Semiconductor chip 70 comprises a diode/rectifier 71 having a top surface 72 and a bottom surface 74 and may be referred to as a diode. A cathode 76 is formed on or from surface 72 and an anode 78 is formed on or from surface 74. Cathode 76 may be referred to as an electrode and anode 78 may be referred to as an electrode. In accordance with an embodiment, semiconductor chip 70 is a rectangular shaped silicon based semiconductor material, wherein the semiconductor material may be referred to as a body of semiconductor material. Diode/Rectifier 71 is not limited to being a silicon based device.

FIG. 4 is a circuit schematic of a semiconductor component 80 in a cascode FET configuration, where semiconductor component 80 is comprised of transistors 82 and 84. Transistor 82 has a gate electrode 82G, a source electrode 82S, and a drain electrode 82D and transistor 84 has a gate electrode 84G, a source electrode 84S, a drain electrode 84D, and a body/substrate terminal 84B. Drain electrode 82D of transistor 82 is electrically connected to source electrode 84S of transistor 84 and source electrode 82S of transistor 82 is electrically connected to gate electrode 84G of transistor 84. Drain electrode 84D may be coupled for receiving a first source of operating potential such as, for example a potential $V_{DD}$, for cascode semiconductor component 80, gate electrode 82G serves as an input terminal for cascoded semiconductor component 80, and source electrode 82S is coupled for receiving a second source of operating potential such as, for example a potential $V_{SS}$. Second source of operating potential $V_{SS}$ may be ground. It should be noted that the substrate of III-N transistor 84 is floating, thus semiconductor component 80 is referred to as being in a floating configuration or substrate floating configuration.

Figure 5:
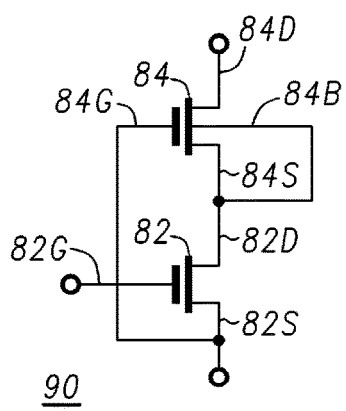
FIG. 5 is a circuit schematic of a semiconductor component in a cascode FET configuration, wherein a substrate of a III-N device is coupled to its source electrode.

FIG. 5 is a circuit schematic 90 of a semiconductor component in a cascode FET configuration. The semiconductor component includes transistors 82 and 84, where transistor 82 has a gate electrode 82G, a source electrode 82S, and a drain electrode 82D and transistor 84 has a gate electrode 84G, a source electrode 84S, a drain electrode 84D, and a body/substrate terminal 84B. Like semiconductor component 80, drain electrode 82D is electrically connected to source electrode 84S, and source electrode 82S is electrically connected to gate electrode 84G, drain electrode 84D may be coupled for receiving the first source of operating potential for cascode semiconductor component 90 (e.g., potential $V_{DD}$), gate electrode 82G serves as an input terminal for cascoded semiconductor component 90, and source electrode 82S is coupled for receiving the second source of operating potential, for example potential $V_{SS}$. In addition, substrate terminal 84B of transistor 84 is electrically connected to source electrode 84S of transistor 84.

Thus, the substrate of transistor 84 is coupled to the same potential as source electrode 84S of transistor 84 and drain electrode 82D of transistor 82.

Figure 6:
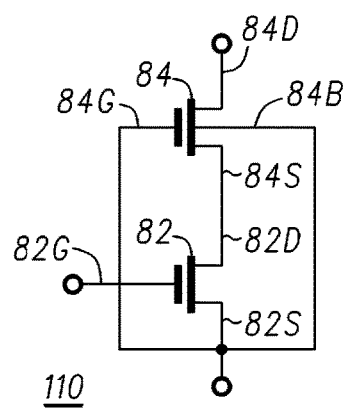
FIG. 6 is a circuit schematic of a semiconductor component in a cascode FET configuration, wherein a substrate of a III-N device is coupled to a source electrode of a silicon semiconductor device.

FIG. 6 is a circuit schematic of a semiconductor component 95 in a cascode FET configuration. Semiconductor component 95 includes transistors 82 and 84, where transistor 82 has a gate electrode 82G, a source electrode 82S, and a drain electrode 82D and transistor 84 has a gate electrode 84G, a source electrode 84S, a drain electrode 84D, and a body/substrate terminal 84B. Like semiconductor component 80, drain electrode 82D is electrically connected to source electrode 84S, source electrode 82S is electrically connected to gate electrode 84G, drain electrode 84D is coupled for receiving a first source of operating potential (e.g., operating potential $V_{DD}$) for cascode semiconductor component 95, gate electrode 82G serves as an input terminal for cascoded semiconductor component 95, and source electrode 82S is coupled for receiving a second source of operating potential, e.g., operating potential $V_{SS}$. In addition, substrate terminal 84B of transistor 84 is electrically connected to source electrode 82S of transistor. Thus, the substrate of transistor 84 is coupled to the same potential as source electrode 82S of transistor 82.

Figure 7:
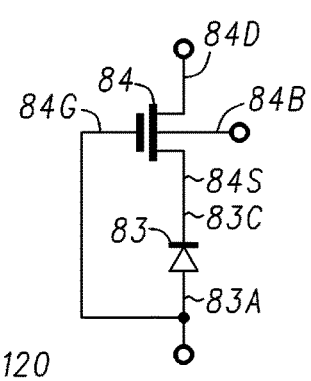
FIG. 7 is a circuit schematic of a semiconductor component in a cascode rectifier configuration, wherein a substrate of a III-N device is floating.

FIG. 7 is a circuit schematic of a semiconductor component 120 in a cascode rectifier configuration. Semiconductor component 120 includes diode/rectifier 83 and a transistor 84, where diode 83 has an anode electrode 83A, and a cathode electrode 83C and transistor 84 has a gate electrode 84G, a source electrode 84S, a drain electrode 84D, and a body/substrate terminal 84B. Cathode electrode 83C is electrically connected to source electrode 84S and anode electrode 83A is electrically connected to gate electrode 84G. Drain electrode 84D may be coupled for receiving a first source of operating potential for cascode semiconductor component 120 such as, for example, potential $V_{DD}$, and anode electrode 83A is coupled for receiving a second source of operating potential such as, for example, source of operating potential $V_{SS}$. It should be noted that the substrate of III-N transistor 84 is floating, thus semiconductor component 120 may be referred to as being in a floating configuration or substrate floating configuration.

Figure 8:
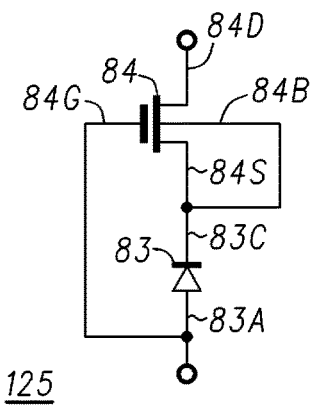
FIG. 8 is a circuit schematic of a semiconductor component in a cascode rectifier configuration, wherein a substrate of a III-N device is coupled to its source electrode.

FIG. 8 is a circuit schematic of a semiconductor component 125 in a cascode rectifier configuration. Semiconductor component 125 includes diode/rectifier 83 coupled to a transistor 84, where diode 83 has an anode electrode 83A, and a cathode electrode 83C and transistor 84 has a gate electrode 84G, a source electrode 84S, a drain electrode 84D, and a body/substrate terminal 84B. Like semiconductor component 120, semiconductor component 125 includes cathode electrode 83C electrically connected to source electrode 84S, anode electrode 83A electrically connected to gate electrode 84G, drain electrode 84D which may be coupled for receiving the first source of operating potential for cascode semiconductor component 125 (e.g., source of operating potential $V_{DD}$), and anode electrode 83A which may be coupled for receiving the second source of operating potential (e.g., source of operating potential $V_{SS}$). In addition, substrate terminal 84B of transistor 84 is electrically connected to source electrode 84S of transistor 84 and cathode electrode 83C of diode 83. Thus, the substrate of transistor 84 is coupled to the same potential as source electrode 84S of transistor 84 and cathode electrode 83C of diode 83.

Figure 9:
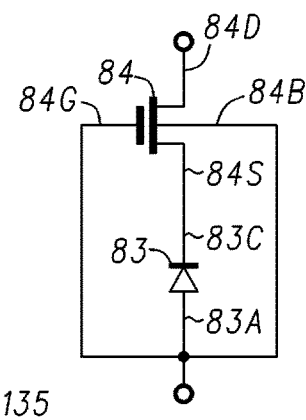
FIG. 9 is a circuit schematic of a semiconductor component in a cascode rectifier configuration, wherein a substrate of a III-N device is coupled to an anode electrode of a silicon semiconductor device.

FIG. 9 is a circuit schematic of a semiconductor component 135 in a cascode rectifier configuration. Semiconductor component 135 includes diode/rectifier 83 and a transistor 84, where diode 83 has an anode electrode 83A and a cathode electrode 83C and transistor 84 has a gate electrode 84G, a source electrode 84S, a drain electrode 84D, and a body/substrate terminal 84B. Cathode electrode 83C is electrically connected to source electrode 84S and anode electrode 83A is electrically connected to gate electrode 84G. Drain electrode 84D may be coupled for receiving the first source of operating potential for cascode semiconductor component 135 (e.g., source of operating potential $V_{DD}$) and anode electrode 83A is coupled for receiving a second source of operating potential such as, for example source of operating potential $V_{SS}$. Substrate terminal 84B of transistor 84 is electrically connected to anode electrode 83A. Thus, the substrate of transistor 84 is coupled to the same potential as anode electrode 83A of diode 83.

Figure 10:
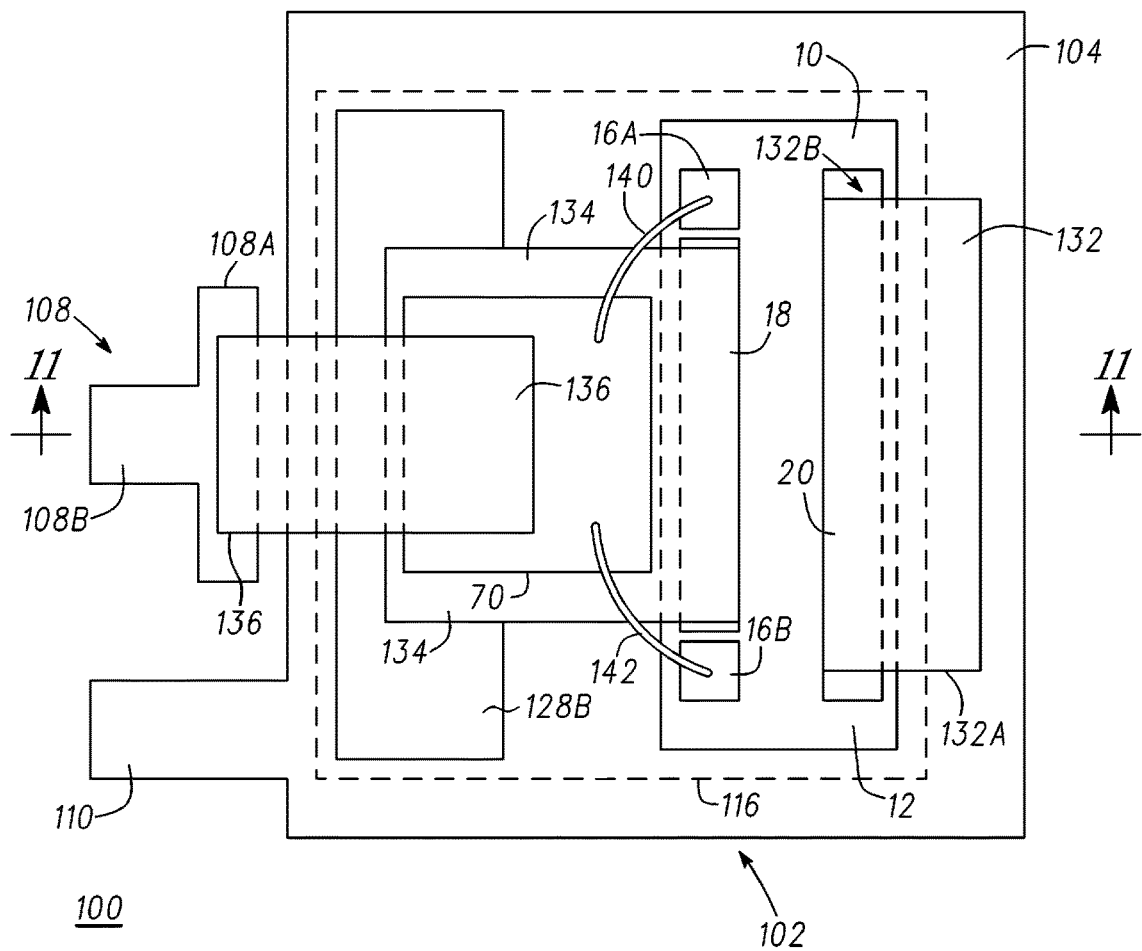
FIG. 10 is a top view of a cascode configured semiconductor component in accordance with another embodiment of the present invention.
Figure 11:
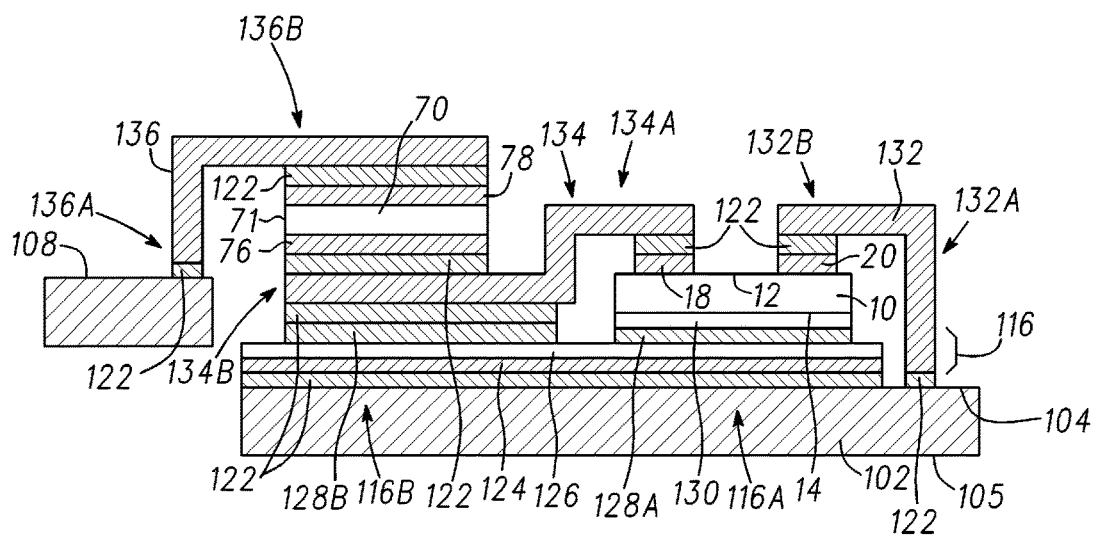
FIG. 11 is a cross-sectional view of the cascode configured semiconductor component of FIG. 10 taken along section line 11-11 of FIG. 10.

FIG. 10 is a top view of a semiconductor component 100 comprising a support 102 having a semiconductor chip 10 and a semiconductor chip 70 bonded thereto in accordance with an embodiment of the present invention. FIG. 11 is a cross-sectional view taken along section line 11-11 of FIG. 10. For the sake of clarity, FIGS. 10 and 11 are described together. What is shown in FIG. 10 is a rectangularly shaped, electrically conductive support or support structure 102 having a surface 104 and a surface 105. Support 102 is not limited to having a rectangular shape, but may have a polygonal shape, a circular shape, an elliptical shape, etc. Semiconductor component 100 further includes an anode lead 108 and a cathode lead 110, where anode lead 108 is electrically isolated from support 102 and cathode lead 110 extends from support 102. Support 102 and cathode lead 110 form a unitary structure, i.e., cathode lead 110 is integrally formed with support 102 and extends from support 102. Thus, cathode lead 110 and support 102 form a unitary structure. By way of example, anode lead 108 is a "T-shaped" structure having a portion 108A and a portion 108B. Semiconductor component 100 may be configured so that the position of anode lead 108 is to the top of the cathode lead 110. This is not a limitation to the present invention. Alternatively, semiconductor component 100 may be configured to have the position of the cathode lead 110 to the top of anode lead 108. The shape of anode lead 108 is also not a limitation to the present invention.

An insulated metal substrate such as, for example, a direct bonded copper substrate 116 having a portion 116A and a portion 116B is bonded to surface 104 using a bonding agent 122. Direct bonded copper substrate 116 is comprised of a layer of dielectric material 126 between layers of electrically conductive material. More particularly, a portion of dielectric layer 126 is between a layer of electrically conductive material 124 and a layer of electrically conductive material 128A and another portion of dielectric layer 126 is between layer of electrically conductive material 124 and a layer of electrically conductive material 128B. By way of example, dielectric layer 126 is ceramic and electrically conductive layers 124, 128A, and 128B are copper. Thus, copper layer 124 is bonded to surface 104 using bonding agent 122. Suitable materials for bonding agent 122 include solder, a conductive epoxy, an electrically conductive die attach material, or the like.

Although an insulated metal substrate 116 is described as being bonded to support 102 by electrically conductive material 122, this is not a limitation of the present invention. Alternatively, a layer of electrically insulating material may be formed on support 102. Then, one or more layers of electrically conductive material may be formed on the layer of insulating material. By way of example, the layer of electrically conductive material is copper. Techniques for forming an insulating material on an electrically conductive substrate such as a leadframe and for forming an electrically conductive material on an insulating material are known to those skilled in the art. It should be noted that semiconductor chip 10 may be mounted to the layer of insulating material and that the layer of insulating material may be a ceramic.

Semiconductor chip 10 is mounted to or bonded to portion 116A of direct bonded copper substrate 116. More particularly, a layer of die attach material 130 is formed on copper layer 128A and surface 14 of semiconductor chip 10 is placed in die attach material 130. Bonding agent 122 is formed on source bond pad 18, drain bond pad 20, and copper layer 128B. Source bond pad 18 is connected to copper layer 128B using an electrical interconnect such as, for example, a clip 134, which has an end 134A electrically connected to source bond pad 18 through bonding agent 122 and an end 134B electrically connected to copper layer 128B through bonding agent 122. End 134A may be referred to as a section 134A and end 134B may be referred to as a section 134B.

Bonding agent 122 is formed on end 134B of clip 134 and cathode 76 of diode 70 is mounted to or bonded to end 134B of clip 134 through bonding agent 122. Anode 78 of diode 71 that is formed from silicon semiconductor chip 70 is electrically connected to anode lead 108 using a second electrical interconnect such as, for example, a clip 136. More particularly, bonding agent 122 is formed on anode 78 of diode 71 and on anode lead 108 and an end 136A of clip 136 is bonded to anode lead 108 through bonding agent 122 and an end 136B of clip 136 is bonded to anode 78 of diode 71 through bonding agent 122.

Drain bond pad 20 of semiconductor chip 10 is electrically connected to support 102 by a clip 132, which clip 132 has an end 132B bonded to drain bond pad 20 through bonding agent 122 and an end 132A bonded to surface 104 of the support structure 102 through bonding agent 122; gate bond pads 16A and 16B are electrically connected to anode 78 of diode 71 by bond wires 140 and 142, respectively; source bond pad 18 of semiconductor chip 10 is electrically connected to cathode 76 by a clip 134. Bond wires such as bond wires 140 and 142 may be referred to as wirebonds or bonding wires.

It should be noted that clips 132 and 136 may be replaced by electrically conductive interconnects such as, for example, bond wires and that bond wires 140, 142, and 144 may be replaced by electrically conductive clips or interconnects.

As those skilled in the art are aware, support 102, direct bonded copper substrate 116, semiconductor chip 10, semiconductor chip 70, clips 132, 134, and 136, and bond wires 140, 142, and 144 may be encapsulated in a protection material (not shown) such as, for example a mold compound.

It should be noted that the die receiving area 102 and the lead 108 may not be on the same plane. However, this is not a limitation of the present invention. It should be appreciated that semiconductor component 100 may be configured for mounting in a through hole package having, for example, a TO-220 outline, a TO-247 outline, a TO-264 outline, a TO-257 outline, or the like.

The cascode configuration as shown in FIG. 10 and FIG. 11 is similar to the circuit schematic shown in FIG. 7, where the III-N transistor of semiconductor chip 10 of FIGS. 10 and 11 is represented by transistor 84 of FIG. 7 and diode 70 of FIGS. 10 and 11 is represented by diode 83 of FIG. 7. Thus, the substrate material, i.e., the substrate, of the III-N transistor of semiconductor chip 10 of semiconductor component 100 is electrically isolated from anode lead 108 and thus is floating. Accordingly, semiconductor component 100 comprises a cascode rectifier configuration with the substrate of the III-N transistor of semiconductor chip 10 floating.

Figure 12:
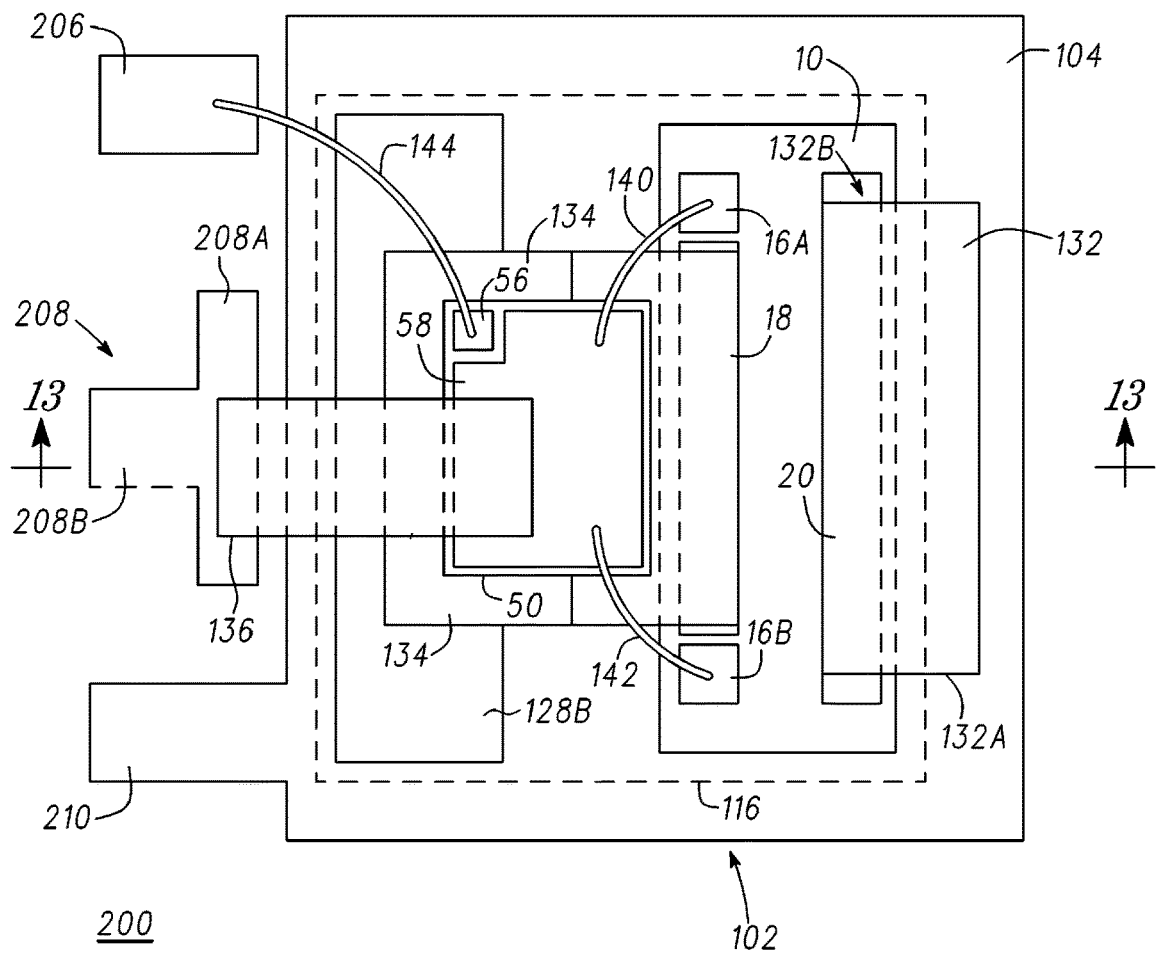
FIG. 12 is a top view of a cascode configured semiconductor component in accordance with another embodiment of the present invention.
Figure 13:
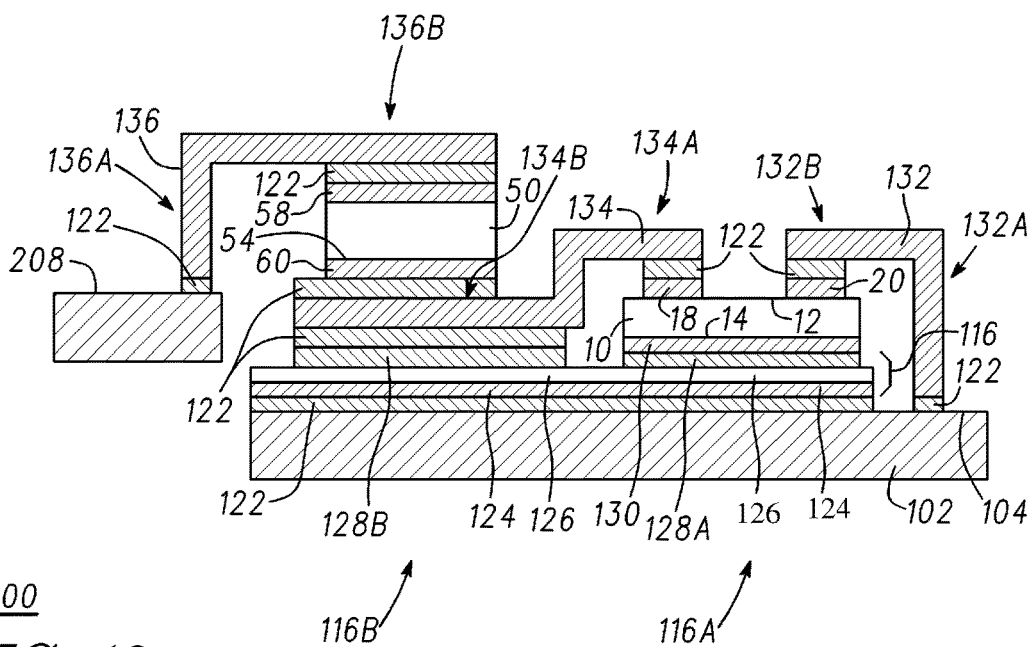
FIG. 13 is a cross-sectional view of the cascode configured semiconductor component of FIG. 12 taken along section line 13-13 of FIG. 12.

FIG. 12 is a top view of a semiconductor component 200 comprising support 102A having a semiconductor chip 10 and a semiconductor chip 50 bonded thereto in accordance with another embodiment of the present invention. FIG. 13 is a cross-sectional view taken along section line 13-13 of FIG. 12. For the sake of clarity, FIGS. 12 and 13 are described together. What is shown in FIG. 12 is a rectangularly shaped, electrically conductive support or support structure 102A having a surface 104. Support structure 102A is similar to support structure 102 except that lead 210 of support 102A serves as a drain lead, lead 208 serves as a source lead, and support 102A further includes an electrically conductive structure 206 that is electrically isolated drain lead 210 and source lead 208. Thus, semiconductor component 200 includes a gate lead 206, a source lead 208, and a drain lead 210, where gate lead 206 and source lead 208 are electrically isolated from support 202. By way of example, source lead 208 is a "T-shaped" structure having a portion 208A and a portion 208B. Semiconductor component 200 is configured so that source lead 208 is between gate lead 206 and drain lead 210; however, this is not a limitation of the present invention. In addition, the shape of the leads is not a limitation of the present invention.

A direct bonded copper substrate 116 having a portion 116A and a portion 116B is bonded to surface 104 using a bonding agent 122. Direct bonded copper substrate 116 is comprised of a layer of dielectric material 126 between layers of electrically conductive material. More particularly, a portion of dielectric layer 126 is between a layer of electrically conductive material 124 and a layer of electrically conductive material 128A and another portion of dielectric layer 126 is between layer of electrically conductive material 124 and a layer of electrically conductive material 128B. By way of example, dielectric layer 126 is ceramic and electrically conductive layers 124, 128A, and 128B are copper. Thus, copper layer 124 is bonded to surface 104 using bonding agent 122. Suitable materials for bonding agent 122 include solder, a conductive epoxy, an electrically conductive die attach material, or the like.

Although an insulated metal substrate 116 is described as being bonded to support 102 by electrically conductive material 122, this is not a limitation of the present invention. Alternatively, a layer of electrically insulating material may be formed on support 102. Then, a layer of electrically conductive material may be formed on the layer of insulating material. By way of example, the layer of electrically conductive material is copper. Techniques for forming an insulating material on an electrically conductive substrate such as a leadframe and for forming an electrically conductive material on an insulating material are known to those skilled in the art.

Semiconductor chip 10 is mounted to or bonded to portion 116A of direct bonded copper substrate 116. More particularly, a layer of die attach material 130 is formed on copper layer 128A and surface 14 of semiconductor chip 10 is placed in die attach material 130. Bonding agent 122 is formed on source bond pad 18, drain bond pad 20, and copper layer 128B. Source bond pad 18 is connected to copper layer 128B using a clip 134, which has an end 134A electrically connected to source bond pad 18 through bonding agent 122 and an end 134B electrically connected to copper layer 128B through bonding agent 122.

Bonding agent 122 is formed on end 134B of clip 134 and a drain contact 60 of semiconductor chip 50 is mounted to or bonded to end 134B of clip 134 through bonding agent 122. Bonding agent 122 is formed on source bond pad 58 and on source lead 208. Source bond pad 58 is electrically connected to source lead 208 using a clip 136. More particularly, an end 136A of clip 136 is bonded to source lead 208 through bonding agent 122 and an end 136B of clip 136 is bonded to source bond pad 58 through bonding agent 122.

Drain bond pad 20 of semiconductor chip 10 is electrically connected to support 102 by a clip 132 having an end 132B bonded to drain bond pad 20 through bonding agent 122 and end 132A bonded to electrically conductive layer 128A through bonding agent 122; gate bond pads 16A and 16B are electrically connected to source bond pad 58 by bond wires 140 and 142, respectively; source bond pad 18 of semiconductor chip 10 is electrically connected to drain contact 60 of semiconductor chip 50 by a clip 134; and gate lead 206 is bonded to gate bond pad 56 by a bond wire 144. Bond wires such as bond wires 140, 142, and 144 may be referred to as wirebonds or bonding wires.

It should be noted that clips 132 and 136 may be replaced by electrically conductive interconnects such as, for example, bond wires and that bonding wires 140, 142, and 144 may be replaced by electrically conductive clips or interconnects.

As those skilled in the art are aware, support 102, direct bonded copper substrate 116, semiconductor chip 10, semiconductor chip, 50, clips 132, 134, and 136, and bond wires 140, 142, and 144 may be encapsulated in a protection material (not shown) such as, for example a mold compound.

It should be noted that the die receiving area 102 and the lead 108 may not be on the same plane. However, this is not a limitation of the present invention. It should be appreciated that semiconductor component 200 may be in a TO-220 package, a TO-247 package, a TO-264 package, a TO-257 package, or the like.

It should be noted that the cascode configuration as shown in FIG. 12 and FIG. 13 may be represented by the circuit schematic shown in FIG. 4, where the III-N transistor of semiconductor chip 10 of FIGS. 12 and 13 is represented by transistor 84 of FIG. 4 and silicon transistor 50 of FIGS. 12 and 13 is represented by transistor 82 of FIG. 4. Thus, the substrate material, i.e., the substrate, of the III-N transistor of semiconductor chip 10 of semiconductor component 200 is electrically isolated from the source lead 208, the drain lead 210, and the gate lead 206 of semiconductor component 200 and thus is floating. Accordingly, semiconductor component 100 comprises a cascode FET configuration with the substrate of the III-N transistor of semiconductor chip 10 floating.

Figure 14:
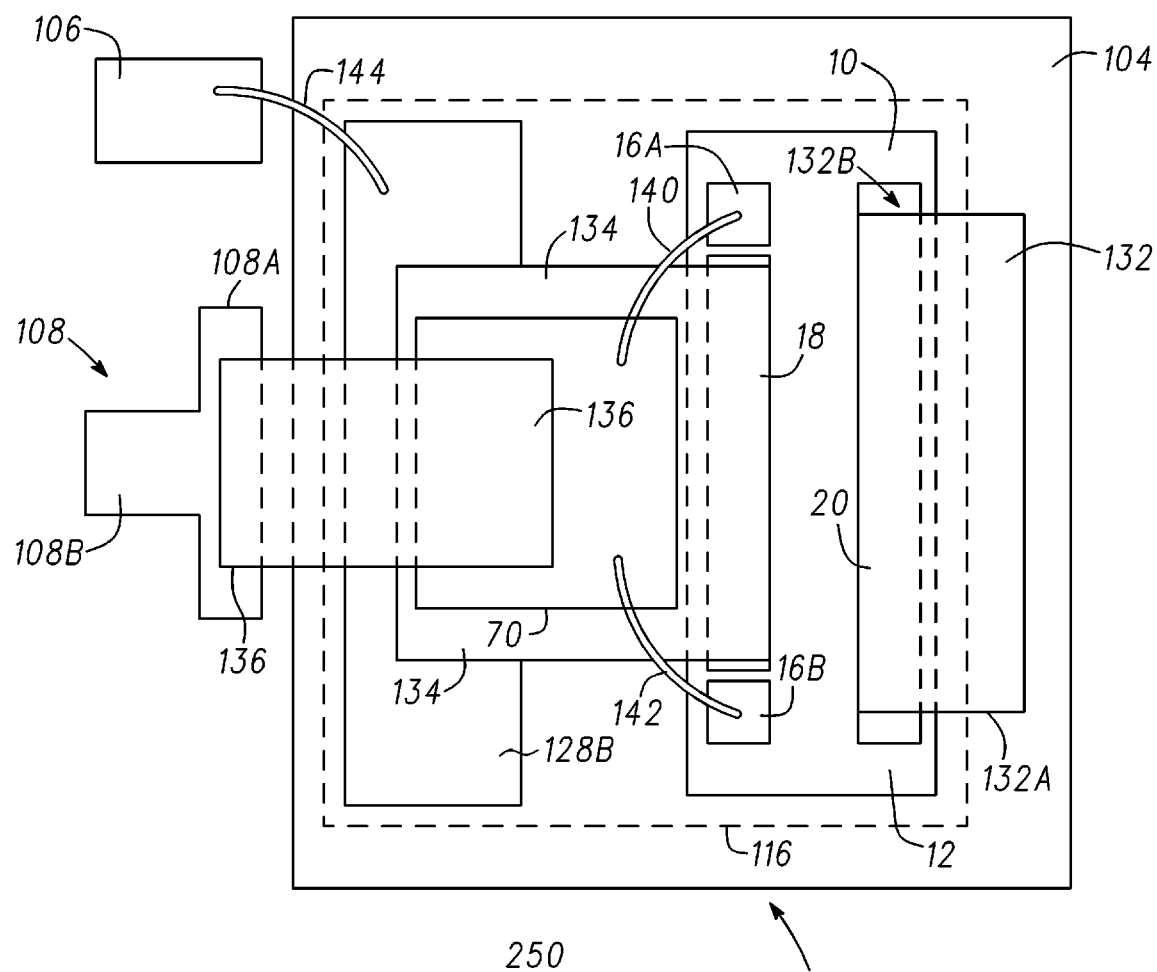
FIG. 14 is a top view of a cascode configured semiconductor component in accordance with another embodiment of the present invention.

FIG. 14 is a top view of a semiconductor component 250 comprising a support 102A having a semiconductor chip 10 and a semiconductor chip 70 bonded thereto and configured for mounting in a QFN package in accordance with an embodiment of the present invention. Support 102A is similar to support 102 in FIG. 10 except cathode lead 110 is absent from support 102A. Thus, the description of support 102 applies to support 102A but without cathode lead 110.

Figure 15:
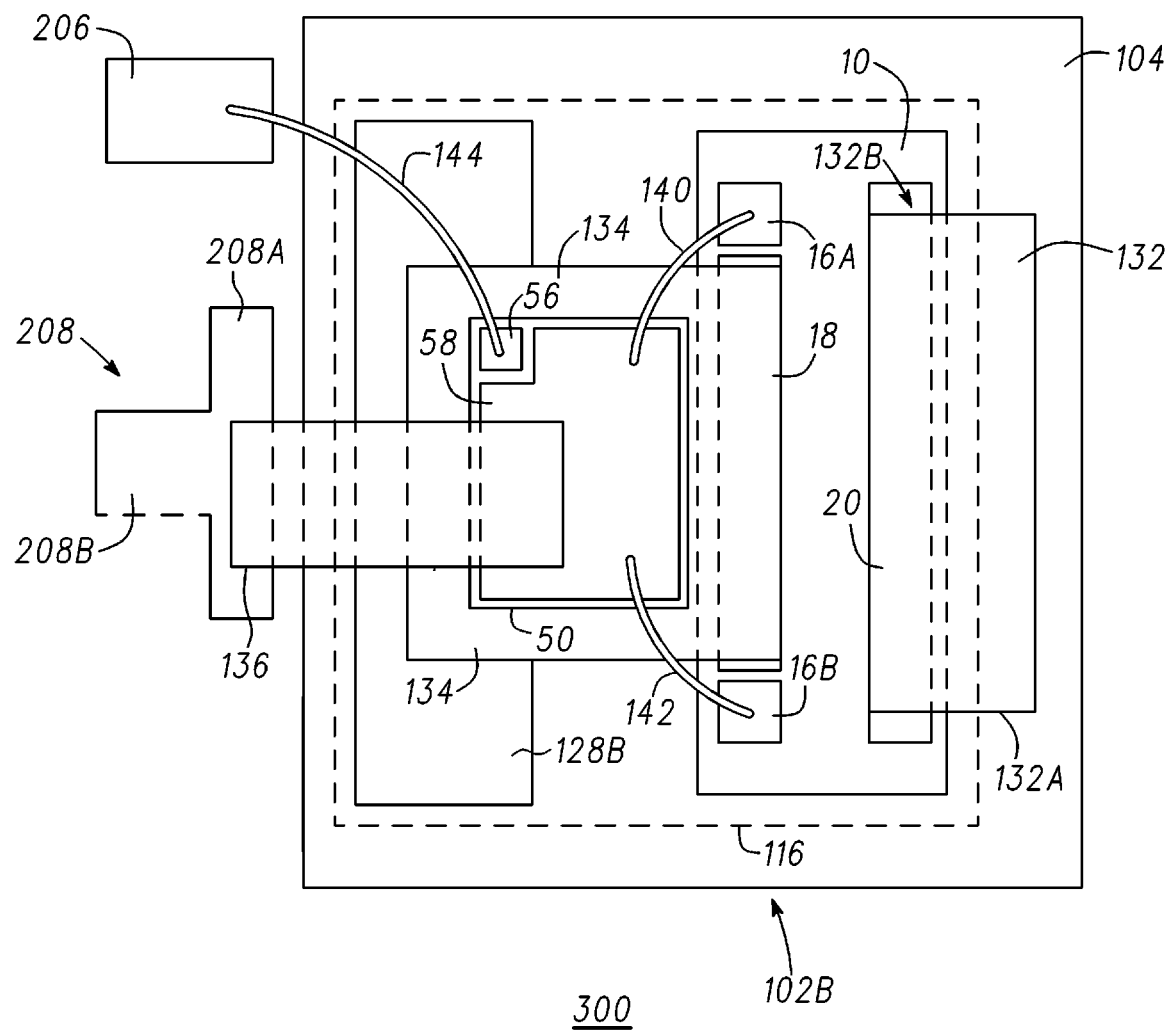
FIG. 15 is a top view of a cascode configured semiconductor component in accordance with another embodiment of the present invention.

FIG. 15 is a top view of a semiconductor component 300 comprising a support 102B having a semiconductor chip 10 and a semiconductor chip 50 bonded thereto and configured for mounting in a QFN package in accordance with an embodiment of the present invention. Support 102B is similar to support 102 in FIG. 12 except drain lead 210 is absent from support 102B. Thus, the description of support 102 applies to support 102B but without drain lead 210.

Figure 16:
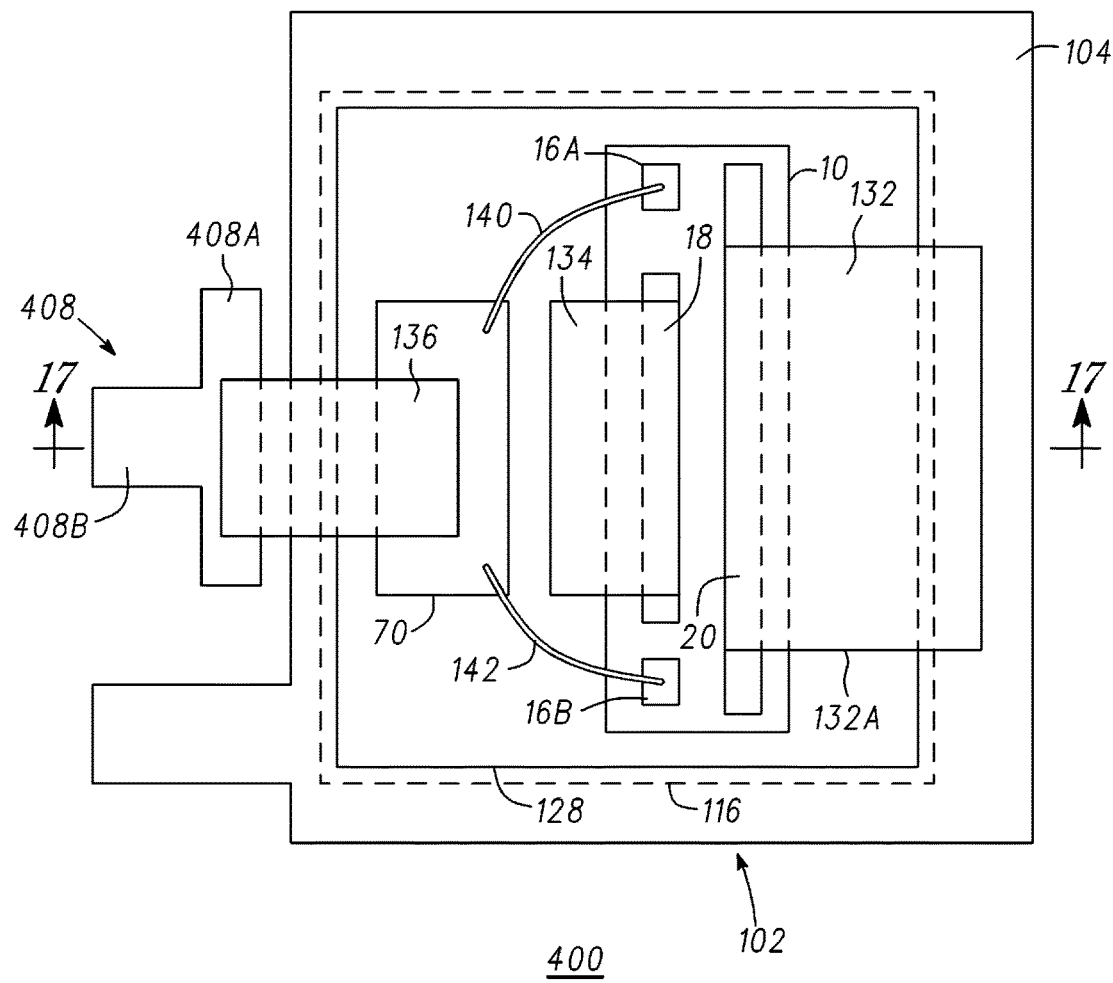
FIG. 16 is a top view of a cascode configured semiconductor component in accordance with another embodiment of the present invention.
Figure 17:
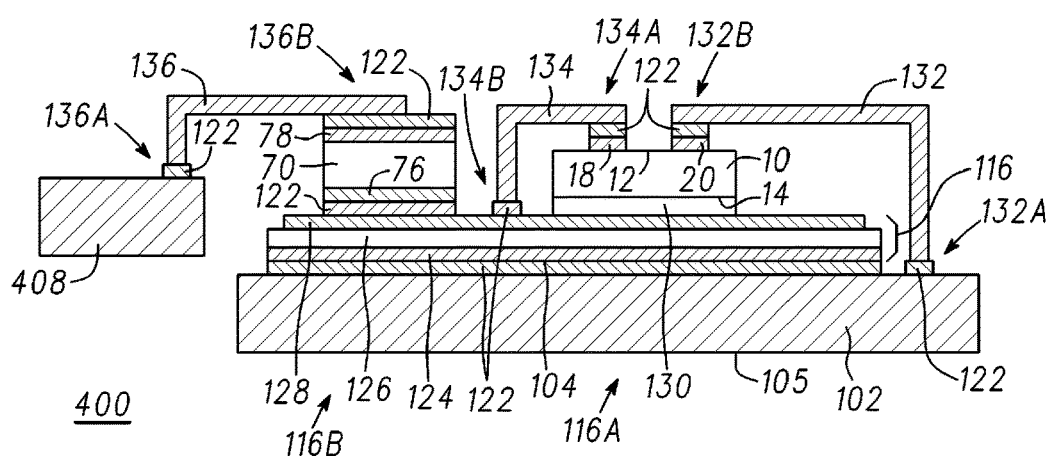
FIG. 17 is a cross-sectional view of the cascode configured semiconductor component of FIG. 16 taken along section line 17-17 of FIG. 16.

FIG. 16 is a top view of a semiconductor component 400 comprising a support 102 having a semiconductor chip 10 and a semiconductor chip 70 bonded thereto in accordance with an embodiment of the present invention. FIG. 17 is a cross-sectional view taken along section line 17-17 of FIG. 16. For the sake of clarity, FIGS. 16 and 17 are described together. What is shown in FIG. 16 is a rectangularly shaped, electrically conductive support or support structure 102 having a surface 104 and a surface 105. Support 102 is not limited to having a rectangular shape, but may have a polygonal shape, a circular shape, an elliptical shape, etc. Semiconductor component 400 further includes an anode lead 408, and a cathode lead 410, where anode lead 408 is electrically isolated from support 102 and cathode lead 410 extends from support 102. Support 102 and cathode lead 410 form a unitary structure, i.e., cathode lead 410 is integrally formed with support 102 and extends from support 102. Thus, cathode lead 410 and support 102 form a unitary structure. By way of example, anode lead 108 is a "T-shaped" structure having a portion 408A and a portion 408B. Semiconductor component 400 is configured so that the position of anode lead 408 is to the top of the cathode lead 410 as shown in FIG. 16. This is not a limitation to the present invention. Semiconductor component 400 can also be configured to have the position of the cathode lead 410 to the top of anode lead 408. The shape of the anode lead 408 is also not a limitation to the present invention.

An insulated metal substrate such as, for example, a direct bonded copper substrate 116 having a portion 116A and a portion 116B is bonded to surface 104 using a bonding agent 122. Direct bonded copper substrate 116 is comprised of a layer of dielectric material 126 between layers of electrically conductive material. More particularly, a portion of dielectric layer 126 is between a layer of electrically conductive material 124 and a layer of electrically conductive material 128. By way of example, dielectric layer 126 is ceramic and electrically conductive layers 124 and 128 are copper. Copper layer 124 is bonded to surface 104 using bonding agent 122. Suitable materials for bonding agent 122 include solder, a conductive epoxy, an electrically conductive die attach material, or the like.

Although an insulated metal substrate 116 is described as being bonded to support 102 by electrically conductive material 122, this is not a limitation of the present invention. Alternatively, a layer of electrically insulating material may be formed on support 102. Then, a layer of electrically conductive material may be formed on the layer of insulating material. By way of example, the layer of electrically conductive material is copper. Techniques for forming an insulating material on an electrically conductive substrate such as, for example, a leadframe and for forming an electrically conductive material on an insulating material are known to those skilled in the art.

Semiconductor chip 10 is mounted to or bonded to portion 116A of direct bonded copper substrate 116. More particularly, a layer of die attach material 130 is formed on copper layer 128 and surface 14 of semiconductor chip 10 is placed in die attach material 130. Bonding agent 122 is formed on source bond pad 18, drain bond pad 20, and copper layer 128. Source bond pad 18 is connected to copper layer 128 using an electrical interconnect such as, for example, a clip 134, which has an end 134A electrically connected to source bond pad 18 through bonding agent 122 and an end 134B electrically connected to copper layer 128 through bonding agent 122.

Cathode 76 of diode 70 is mounted to or bonded to copper layer 128 through bonding agent 122. Thus, the substrate of the semiconductor chip 10, the cathode 76 of the diode 70 and the source of the semiconductor chip 10 are at the same potential. Anode 78 of diode 71 that is formed from semiconductor chip 70 is electrically connected to anode lead 408 using a second electrical interconnect such as, for example, a clip 136. More particularly, bonding agent 122 is formed on anode 78 of diode 70 and on anode lead 408 and an end 136A of clip 136 is bonded to anode lead 108 through bonding agent 122 and an end 136B of clip 136 is bonded to anode 78 of diode 71 through bonding agent 122. Clip 136 electrically couples anode 78 of diode 71 to anode lead 408.

Drain bond pad 20 of semiconductor chip 10 is electrically connected to support 102 by a clip 132, which has an end 132B bonded to drain bond pad 20 through bonding agent 122 and an end 132A bonded to surface 104 of the support structure 102 through bonding agent 122; gate bond pads 16A and 16B are electrically connected to anode 78 of diode 70 by bond wires 140 and 142, respectively; source bond pad 18 of semiconductor chip 10 is electrically connected to cathode 76 through clip 134 and the copper layer 128. Bond wires such as bond wires 140 and 142 may be referred to as wirebonds or bonding wires.

It should be noted that clips 132 and 136 may be replaced by electrically conductive interconnects such as, for example, bond wires, and bonding wires 140, 142, and 144 may be replaced by electrically conductive clips or interconnects.

As those skilled in the art are aware, support 102, direct bonded copper substrate 116, semiconductor chip 10, semiconductor chip 70, clips 132, 134, and 136, and bond wires 140, 142, and 144 may be encapsulated in a protection material (not shown) such as, for example a mold compound.

It should be noted that the die receiving area 102 and the lead 108 may not be on the same plane. However, this is not a limitation of the present invention. It should be appreciated that semiconductor component 10 may be configured for mounting in a through hole package having, for example, a TO-220 outline, a TO-247 outline, a TO-264 outline, a TO-257 outline, or the like.

The cascode configuration as shown in FIGS. 16 and 17 may be represented by the circuit schematic shown in FIG. 8, where the III-N transistor of semiconductor chip 10 of FIGS. 16 and 17 is represented by transistor 84 of FIG. 8 and diode 70 of FIGS. 16 and 17 is represented by diode 83 of FIG. 8. Thus, the substrate material, i.e., the substrate, of the III-N transistor of semiconductor chip 10 of semiconductor component 400 is electrically connected to its source and to cathode 76 of diode 71. Accordingly, semiconductor component 400 comprises a cascode rectifier configuration in which the substrate of III-N transistor 10 is at the same potential as the source of the III-N transistor of semiconductor chip 10 and cathode 76 of diode 71.

Figure 18:
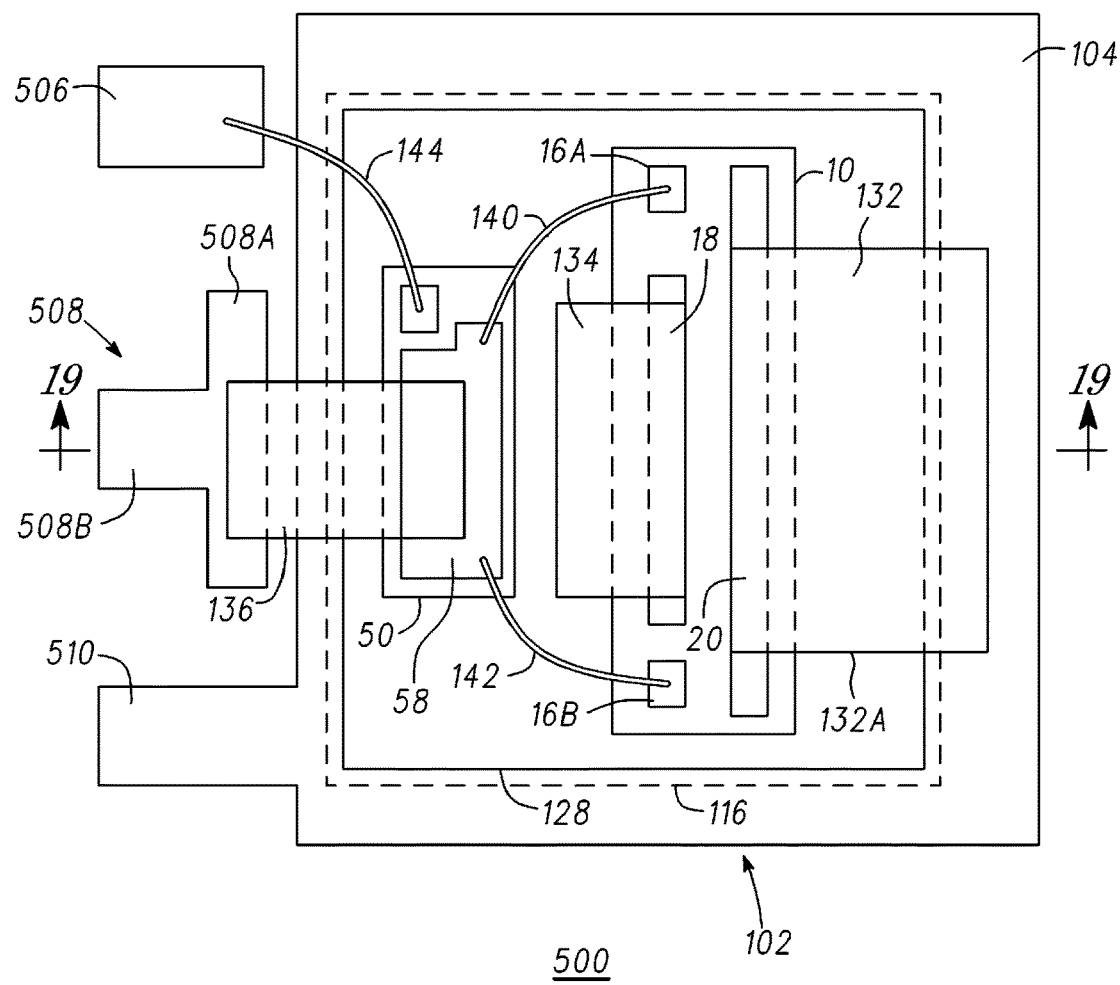
FIG. 18 is a top view of a cascode configured semiconductor component in accordance with another embodiment of the present invention.
Figure 19:
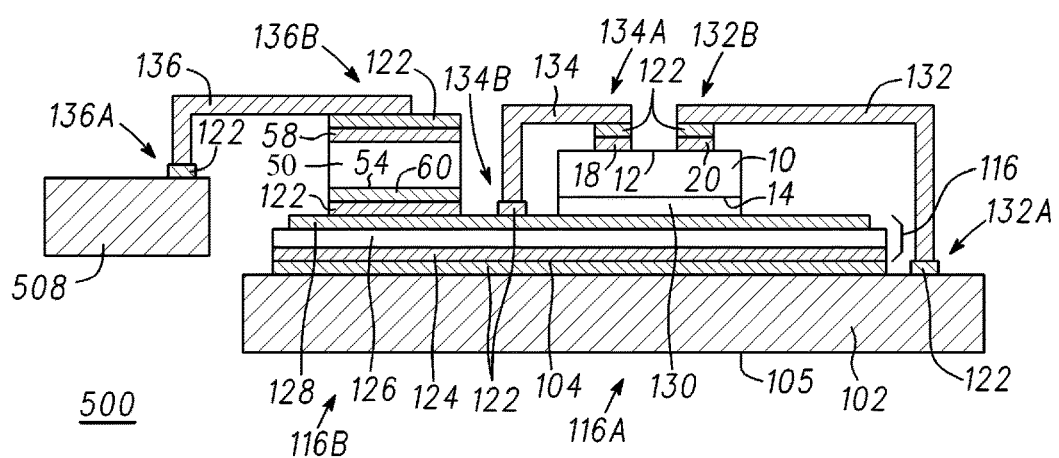
FIG. 19 is a cross-sectional view of the cascode configured semiconductor component of FIG. 18 taken along section line 19-19 of FIG. 18.

FIG. 18 is a top view of a semiconductor component 500 comprising support 102 having a semiconductor chip 10 and a semiconductor chip 50 bonded thereto in accordance with another embodiment of the present invention. FIG. 19 is a cross-sectional view taken along section line 19-19 of FIG. 18. For the sake of clarity, FIGS. 18 and 19 are described together. What is shown in FIG. 18 is a rectangularly shaped, electrically conductive support or support structure 102 having a surface 104. Semiconductor component 500 further includes a gate lead 506, a source lead 508, and a drain lead 510, where gate lead 506 and source lead 508 are electrically isolated from support 102. By way of example, source lead 508 is a "T-shaped" structure having a portion 508A and a portion 508B. Semiconductor component 500 is configured so that source lead 508 is between gate lead 506 and drain lead 510; however, this is not a limitation of the present invention. The shape of the leads is not a limitation of the present invention.

An insulated metal substrate such as, for example, a direct bonded copper substrate 116 having a portion 116A and a portion 116B is bonded to surface 104 using a bonding agent 122. Direct bonded copper substrate 116 is comprised of a layer of dielectric material 126 between layers of electrically conductive material. More particularly, a portion of dielectric layer 126 is between a layer of electrically conductive material 124 and a layer of electrically conductive material 128. By way of example, dielectric layer 126 is ceramic and electrically conductive layers 124 and 128 are copper. Thus, copper layer 124 is bonded to surface 104 using bonding agent 122. Suitable materials for bonding agent 122 include solder, a conductive epoxy, an electrically conductive die attach material, or the like.

Although an insulated metal substrate 116 is described as being bonded to support 102 by electrically conductive material 122, this is not a limitation of the present invention. Alternatively, a layer of electrically insulating material may be formed on support 102. Then, a layer of electrically conductive material may be formed on the layer of insulating material. By way of example, the layer of electrically conductive material is copper. Techniques for forming an insulating material on an electrically conductive substrate such as a leadframe and for forming an electrically conductive material on an insulating material are known to those skilled in the art.

Semiconductor chip 10 is mounted to or bonded to portion 116A of direct bonded copper substrate 116. More particularly, a layer of die attach material 130 is formed on copper layer 128 and surface 14 of semiconductor chip 10 is placed in die attach material 130. Bonding agent 122 is formed on source bond pad 18, drain bond pad 20, and copper layer 128. Source bond pad 18 is connected to copper layer 128 using a clip 134, which has an end 134A electrically connected to source bond pad 18 through bonding agent 122 and an end 134B electrically connected to copper layer 128 through bonding agent 122.

Bonding agent 122 is formed on the copper layer 128 and drain contact 60 of semiconductor chip 50 is mounted to or bonded to end 128 through bonding agent 122. Thus, the substrate of the semiconductor chip 10, the source of semiconductor chip 10, and the drain of the semiconductor chip 50 are at the same potential. Bonding agent 122 is formed on source bond pad 58 and on source lead 508. Source bond pad 58 is electrically connected to source lead 208 using a clip 136. More particularly, an end 136A of clip 136 is bonded to source lead 508 through bonding agent 122 and an end 136B of clip 136 is bonded to source bond pad 58 through bonding agent 122.

Drain bond pad 20 of semiconductor chip 10 is electrically connected to support 102 by a clip 132, which clip 132 has an end 132B bonded to drain bond pad 20 through bonding agent 122 and end 132A bonded to electrically conductive layer 128A through bonding agent 122; gate bond pads 16A and 16B are electrically connected to source bond pad 58 by bond wires 140 and 142, respectively; source bond pad 18 of semiconductor chip 10 is electrically connected to drain contact 60 of semiconductor chip 50 by a clip 134; and gate lead 506 is electrically bonded to gate bond pad 56 by a bond wire 144. Bond wires such as bond wires 140, 142, and 144 may be referred to as wirebonds or bonding wires.

It should be noted that clips 132 and 136 may be replaced by electrically conductive interconnects such as, for example, bond wires and bonding wires 140, 142, and 144 may be replaced by electrically conductive clips or interconnects.

As those skilled in the art are aware, support 102, direct bonded copper substrate 116, semiconductor chip 10, semiconductor chip, 50, clips 132, 134, and 136, and bond wires 140, 142, and 144 may be encapsulated in a protection material (not shown) such as, for example a mold compound.

It should be noted that the die receiving area 102 and the lead 508 may not be in the same plane. However, this is not a limitation of the present invention. It should be appreciated that semiconductor component 500 may be configured for mounting in a through hole package having, for example, a TO-220 outline, a TO-247 outline, a TO-264 outline, a TO-257 outline, or the like.

It should be noted that the cascode configuration as shown in FIG. 18 and FIG. 19 may be represented by the circuit schematic shown in FIG. 5, where the III-N transistor of semiconductor chip 10 of FIGS. 18 and 19 is represented by transistor 84 of FIG. 5 and silicon transistor of semiconductor chip 50 of FIGS. 18 and 19 is represented by transistor 82 of FIG. 5. Thus, the substrate material, i.e., the substrate, of the III-N transistor of semiconductor chip 10 of semiconductor component 500 is electrically connected to the source of the III-N transistor of semiconductor chip 10 and to the drain of silicon transistor of semiconductor chip 50. Accordingly, semiconductor component 500 comprises a cascode Field Effect Transistor (FET) configuration in which the substrate of the III-N transistor of semiconductor chip 10 is at the potential of the source of the III-N transistor of semiconductor chip 10 and the drain of silicon FET 50.

Figure 20:
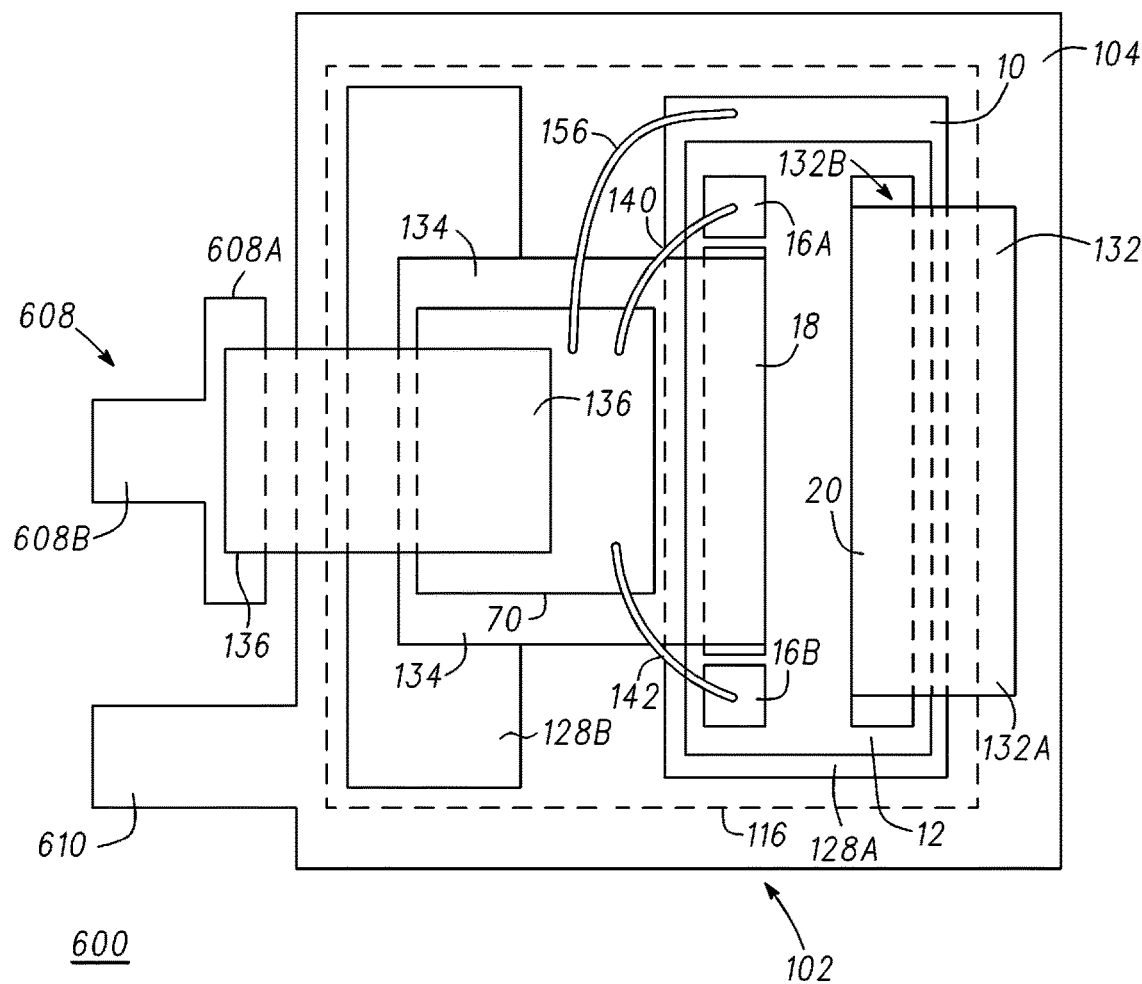
FIG. 20 is a top view of a cascode configured semiconductor component in accordance with another embodiment of the present invention.

FIG. 20 is a top view of a semiconductor component 600 comprising a support 102 having a semiconductor chip 10 and a semiconductor chip 70 bonded thereto and configured for mounting in a through hole package in accordance with an embodiment of the present invention. Support 102 has been described with reference to FIG. 10. A bonding wire 156 electrically connects the substrate of the semiconductor chip 10 to anode 78 of semiconductor chip 70.

The cascode configuration as shown in FIG. 20 is similar to the circuit schematic shown in FIG. 9, where a III-N transistor of semiconductor chip 10 of FIG. 20 is represented by transistor 84 of FIG. 9 and diode 71 of semiconductor chip 70 of FIG. 20 is represented by diode 83 of FIG. 9. Thus, the substrate material, i.e., the substrate, of the III-N transistor of semiconductor chip 10 of semiconductor component 600 is electrically connected to anode lead 108 which is anode 78 of semiconductor chip 70. Accordingly, semiconductor component 600 comprises a cascode rectifier configuration with the substrate of the III-N transistor of semiconductor chip 10 at the same potential as the anode of diode 71 which is fabricated from semiconductor chip 70.

Figure 21:
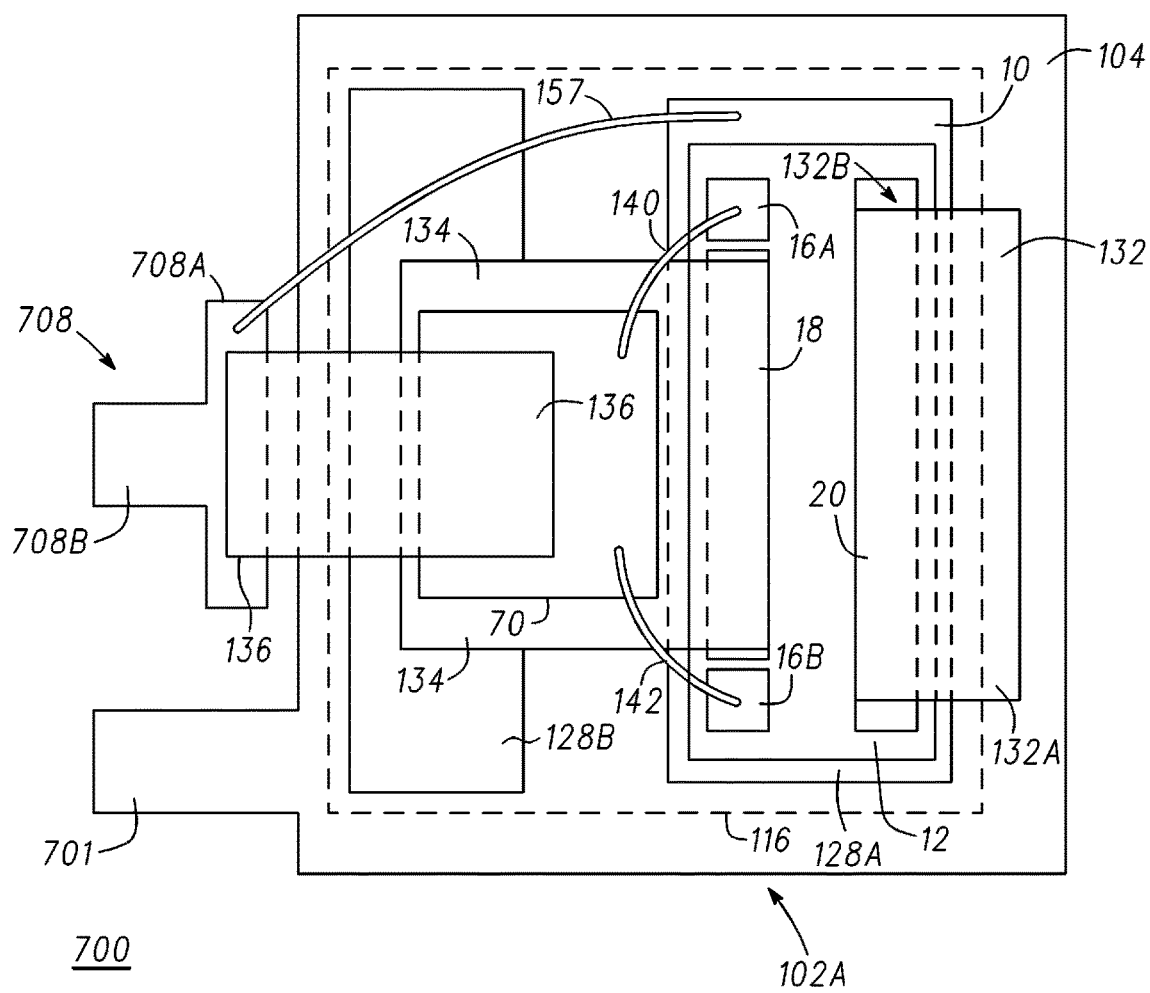
FIG. 21 is a top view of a cascode configured semiconductor component in accordance with another embodiment of the present invention.

FIG. 21 is a top view of a semiconductor component 700 comprising a support 102 having a semiconductor chip 10 and a diode 70 bonded thereto and configured for mounting in a through hole package in accordance with an embodiment of the present invention. Support 102 has been described with reference to FIG. 10. A bonding wire 157 electrically connects the substrate of a III-N transistor of semiconductor chip 10 to anode lead 108. Thus, bonding wire 157 in conjunction with clip 136 electrically connects the substrate of the III-N transistor of semiconductor chip 10 to the anode 78 of semiconductor chip 70. The cascode configuration as shown in FIG. 21 is represented by the circuit schematic shown in FIG. 9, where III-N transistor 10 of FIG. 21 is represented by transistor 84 of FIG. 9 and diode 70 of FIG. 21 is represented by diode 83 of FIG. 9. Thus, the substrate material, i.e., the substrate, of the III-N transistor semiconductor chip 10 of semiconductor component 700 is electrically connected to anode lead 108 which is electrically connected to anode 78 of semiconductor chip 70. Accordingly, semiconductor component 700 comprises a cascode rectifier configuration with the substrate of the III-N transistor of semiconductor chip 10 at the same potential as anode 78 of diode 71 which is fabricated from semiconductor chip 70.

Figure 22:
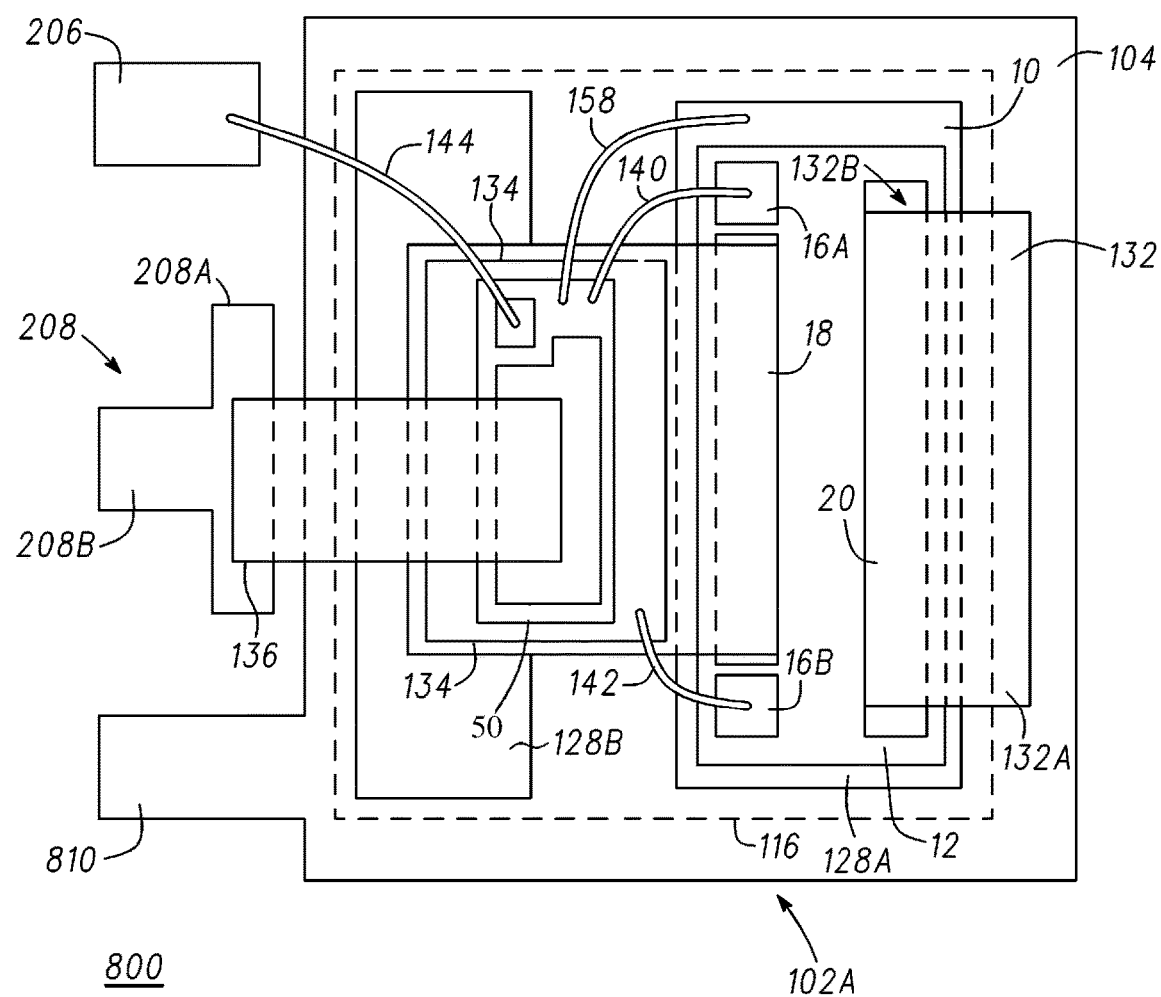
FIG. 22 is a top view of a cascode configured semiconductor component in accordance with another embodiment of the present invention.

FIG. 22 is a top view of a semiconductor component 800 comprising a support 102A having a semiconductor chip 10 and a semiconductor chip 50 bonded thereto and configured for mounting in a through hole package in accordance with an embodiment of the present invention. Support 102A has been described with reference to FIG. 12. Semiconductor component 800 is similar to semiconductor component 200 of FIGS. 12 and 13 except that a bond wire 158 connects the substrate of the semiconductor chip 10 to source pad 58 of semiconductor chip 50. It should be noted that the cascode configuration as shown in FIG. 22 is similar to the circuit schematic shown in FIG. 6, where semiconductor chip 10 of FIG. 20 is represented by transistor 84 of FIG. 6 and silicon transistor 50 of FIG. 20 is represented by transistor 82 of FIG. 6. Thus, the substrate material, i.e., the substrate, of semiconductor chip 10 of semiconductor component 200 is electrically connected to the source lead 208 of semiconductor component 200 and thus at the same potential as the source of silicon transistor 50. Accordingly, semiconductor component 800 comprises a cascode FET configuration with the substrate of semiconductor chip 10 at the same potential as the source of silicon transistor 50.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:
1. A semiconductor component, comprising:
 a support having a surface and a cathode lead that is integral with and extends from the support;
 an anode lead adjacent to and electrically isolated from the support;
 a substrate having a first portion and a second portion, the substrate bonded to the support;
 a first semiconductor chip having a first surface and a second surface, wherein a source bond pad extends from a first portion of the first surface, a drain bond pad extends from a second portion of the first surface, and a gate bond pad extends from a third portion of the first surface, the second surface bonded to the first portion of the substrate, the drain bond pad coupled to the surface of the support, wherein the first semiconductor chip is configured from a III-N semiconductor material;
 a first electrical interconnect having a first end and a second end, the first end of the first electrical interconnect coupled to the source bond pad of the first semi- conductor chip and the second end of the first electrical interconnect coupled to the second portion of the substrate;
a second semiconductor chip electrically coupled to the second end of the first electrical interconnect, the second semiconductor chip electrically isolated from the cathode lead of the support by the substrate, wherein the second semiconductor chip comprises a diode having a first surface and a second surface, and wherein an anode is formed from the first surface and a cathode is formed from the second surface; and
a second electrical interconnect having a first end and a second end, the first end of the second electrical interconnect coupled to the anode lead and the second end of the second electrical interconnect coupled to the second semiconductor chip.

2. The semiconductor component of claim 1, wherein the substrate is an insulated metal substrate comprises:
a first layer of electrically conductive material;
a layer of dielectric material on the first layer of electrically conductive material;
a second layer of electrically conductive material formed on a first portion of the layer of dielectric material, wherein the second layer of electrically conductive material serves as the first portion of the insulated metal substrate; and
a third layer of electrically conductive material formed on a second portion of the layer of dielectric material, wherein the third layer of electrically conductive material serves as the second portion of the insulated metal substrate.

3. The semiconductor component of claim 2, wherein the first layer of electrically conductive material, the second layer of electrically conductive material, and the third layer of electrically conductive material are comprised of copper.

4. The semiconductor component of claim 3, wherein the second surface of the first semiconductor chip is bonded to the first portion of the insulated metal substrate.

5. The semiconductor component of claim 4, further including a third electrical interconnect having a first end and a second end, the first end of the third electrical interconnect coupled to the support and the second end of the third electrical interconnect coupled to the drain bond pad of the first semiconductor chip.

6. The semiconductor component of claim 5, wherein the cathode is bonded to the second end of the first electrical interconnect.

7. The semiconductor component of claim 6, further including a fourth electrical interconnect having a first end and a second end, the first end of the fourth electrical interconnect coupled to the anode of the second semiconductor chip and the second end of the fourth electrical interconnect coupled to the gate bond pad of the first semiconductor chip.

8. The semiconductor component of claim 5, wherein the second end of the first electrical interconnect is coupled to the cathode of the second semiconductor chip.

9. The semiconductor component of claim 8, further including a fourth electrical interconnect having a first end and a second end, the first end of the fourth electrical interconnect coupled to the anode of the second semiconductor chip and the second end of the fourth electrical interconnect coupled to the gate bond pad of the first semiconductor chip.

10. The semiconductor component of claim 1, wherein the second end of the second electrical interconnect is coupled to the anode of the second semiconductor chip.

11. The semiconductor component of claim 10, further including:
a third electrical interconnect coupled between the anode of the second semiconductor chip and the first portion of the substrate; and
a fourth electrical interconnect coupled between the gate bond pad of the first semiconductor chip and the anode of the second semiconductor chip.

12. The semiconductor component of claim 10, wherein the substrate is an insulated metal substrate comprising:
a first layer of electrically conductive material;
a layer of dielectric material on the first layer of electrically conductive material; and
a second layer of electrically conductive material formed on the layer of dielectric material.

13. A semiconductor component, comprising:
a polygonal shaped support having a surface;
a substrate having a first portion and a second portion, a first electrically conductive layer formed on the second portion of the substrate;
a first semiconductor chip coupled to the first portion of the substrate, the first semiconductor chip having a first surface and a second surface, a source bond pad at a first portion of the first surface, a drain bond pad at a second portion of the first surface, and a gate bond pad at a third portion of the first surface, the first semiconductor chip comprising a III-N semiconductor material;
a first clip having a first section and a second section, the first section of the first clip coupled to the source bond pad of the first semiconductor chip and the second section of the first clip coupled to the first electrically conductive layer; and
a second semiconductor chip coupled to the second section of the first clip, the second semiconductor chip having a first surface and a second surface.

14. The semiconductor component of claim 13, further including a first lead extending from the polygonal shaped support and a second lead spaced apart from the polygonal shaped support.

15. The semiconductor component of claim 14, wherein the second semiconductor chip has an anode at the first surface and a cathode at the second surface, wherein the cathode of the second semiconductor chip is coupled to the first electrically conductive layer on the substrate, a first electrical interconnect having a first end and a second end, the first end of the first electrical interconnect is coupled to the anode of the second semiconductor chip, and the second end of the first electrical interconnect is coupled to the second lead.

16. The semiconductor component of claim 15, further including a second electrical interconnect having a first end and a second end, the first end of the second electrical interconnect coupled to the drain bond pad of the first semiconductor chip and the second end of the second electrical interconnect coupled to the surface of the polygonal shaped support.

17. The semiconductor component of claim 15, further including a second electrical interconnect having a first end and a second end, wherein the first end of the second electrical interconnect is coupled to the gate bond pad of the first semiconductor chip and the second end of the second electrical interconnect is bonded to the anode of the second semiconductor chip.

18. The semiconductor component of claim 13, further including:
a second electrically conductive material over and electrically isolated from the first portion of the substrate, wherein the second surface of the first semiconductor chip is bonded to the second electrically conductive material;

a first electrical interconnect coupled between the first surface of the second semiconductor chip and the second electrically conductive material.

19. A semiconductor component, comprising:

a support having a surface and a second surface;

an anode lead adjacent to and electrically isolated from the support;

a substrate having a first portion and a second portion, the substrate bonded to the support;

a first semiconductor chip having a first surface and a second surface, wherein a source bond pad extends from a first portion of the first surface, a drain bond pad extends from a second portion of the first surface, and a gate bond pad extends from a third portion of the first surface, the second surface bonded to the first portion of the substrate, the drain bond pad coupled to the surface of the support, wherein the first semiconductor chip is configured from a III-N semiconductor material;

a first electrical interconnect having a first end and a second end, the first end of the first electrical interconnect coupled to the source bond pad of the first semiconductor chip and the second end of the first electrical interconnect coupled to the second portion of the substrate;

a second semiconductor chip electrically coupled to the second end of the first electrical interconnect, the second semiconductor chip comprising a diode having a cathode and an anode; and a second electrical interconnect having a first end and a second end, the first end of the second electrical interconnect coupled to the anode lead and the second end of the second electrical interconnect coupled to the anode of the second semiconductor chip.

20. The semiconductor component of claim 19, wherein the substrate comprises an insulated metal substrate coupled to the support, and further including:

a third electrical interconnect having a first end coupled to the drain bond pad of the first semiconductor chip and a second end coupled to the support; and a fourth electrical interconnect having a first end coupled to the anode of the second semiconductor chip and a second end coupled to the gate bond pad of the first semiconductor chip.

21. The semiconductor component of claim 19, wherein the cathode is bonded to the second end of the first electrical interconnect.

* * * * *